(12) United States Patent
Gulati et al.

(10) Patent No.: US 8,378,711 B2
(45) Date of Patent: Feb. 19, 2013

(54) DETECTION OF SINGLE BIT UPSET AT DYNAMIC LOGIC DUE TO SOFT ERROR IN REAL TIME

(75) Inventors: Chirag Gulati, Rajasthan (IN); Jitendra Dasani, Greater Noida (IN); Rita Zappa, Milan (IT); Stefano Corbani, Pioltello (IT)

(73) Assignees: STMicroelectronics S.r.l., Agrate Brianza (MI) (IT); STMicroelectronics International N.V., Amsterdam (NL)

( * ) Notice: Subject to any disclaimer, the term of this patent is extended or adjusted under 35 U.S.C. 154(b) by 38 days.

(21) Appl. No.: 13/038,236

(22) Filed: Mar. 1, 2011

(65) Prior Publication Data

US 2012/0223735 A1 Sep. 6, 2012

(51) Int. Cl.
*H03K 19/003* (2006.01)
(52) U.S. Cl. .................. 326/9; 326/14; 326/58; 326/98
(58) Field of Classification Search ............. 326/9, 14, 326/56–58, 93, 95–98
See application file for complete search history.

(56) References Cited

U.S. PATENT DOCUMENTS

| | | | | |
|---|---|---|---|---|
| 6,058,041 | A * | 5/2000 | Golke et al. | 365/156 |
| 7,741,865 | B1* | 6/2010 | Sharpe-Geisler et al. | 326/14 |
| 2004/0165418 | A1* | 8/2004 | Lesea | 365/154 |
| 2006/0267653 | A1* | 11/2006 | Fulkerson | 327/208 |
| 2008/0258792 | A1* | 10/2008 | Carlson et al. | 327/291 |
| 2009/0249141 | A1* | 10/2009 | Yasuda | 714/724 |
| 2009/0249175 | A1* | 10/2009 | Chandra et al. | 714/822 |
| 2011/0302460 | A1* | 12/2011 | Idgunji et al. | 714/55 |

* cited by examiner

*Primary Examiner* — Jason M Crawford
(74) *Attorney, Agent, or Firm* — Hogan Lovells US LLP

(57) ABSTRACT

A circuit for detecting a single bit upset in a dynamic logic circuit includes a latch circuit having an input for receiving a reset signal, and an output for providing a flag output signal, the latch circuit being clocked by a first clock signal, a first transistor having a drain coupled to the output of the latch circuit, a gate for receiving a second clock signal, and a source, and a second transistor having a drain coupled to the source of the first transistor, a gate for receiving a third clock signal, and a source coupled to ground.

20 Claims, 9 Drawing Sheets

902 — using a latch circuit to generate a flag signal indicative of the single bit upset in a previous cycle of an external clock signal based on an internal signal indicative of self-timed memory of the dynamic logic circuit

DETECTION OF SINGLE BIT UPSET AT DYNAMIC LOGIC DUE TO SOFT ERROR IN REAL TIME

FIELD OF INVENTION

The present invention broadly relates to a circuit for detecting a single bit upset (SBU) in a dynamic logic circuit and a method of detecting a single bit upset (SBU) in a dynamic logic circuit.

BACKGROUND

In deep sub-micrometer semiconductor technology, due to soft errors and hard failures (e.g. Stuck Open/At or high/low resistive bridging), achieving a low value of Failures In Time (FIT) is a big challenge. Furthermore, applications in e.g. automotive, medical, petrochemical and space fields have high Safety Integrity Level (SIL) requirements. Thus, it is important to prevent any potentially dangerous effect of errors or at least to detect the errors and take proper reaction.

Typically, for safety features in semiconductor memory, two areas of investigation that are considered include data path fault coverage, and address and control path fault coverage. For example, in static random access memory (SRAM), the Error Correction Codes (ECC) bits are used to cover problems in cell arrays and input-output (I/O) parts. Thus, any single bit upset (SBU) due to soft error rate (SER) in cell array or I/O parts are fully covered by ECC. However, any SBU occurring in an address decoding path can lead to multi-bit failures, which are not completely detectable by the ECC or other means like built-in self-test (BIST) or scan chains, etc. in real-time applications of the memory in the product life-time.

In addition, dynamic logic is generally more prone to soft errors as the FIT rate for dynamic logic is much higher than the FIT rate for combinational logic. For example, in conventional latches (an example of which is shown in FIG. 1a), the positive feedback between nodes IN and OUT amplifies the effect of a radiation particle hit (e.g. an α-particle or a high-energy neutron) on any node and results in a flipping of the data stored. Thus, any SBU on one of the latches present in the memory can lead to a wrong operation. It has been reported that in the current technologies for small to medium size memory, instances of soft failure of dynamic logic (latches) contribute up to about 90% of the failures in real time.

Particularly, the latch on the internal clock of the memory (as shown in FIG. 1b) is somewhat different from all other latches used in the memory because it has a set and auto-reset behavior matched with the internal activity of the memory. The challenge on this type of latch is that the information stored is a timing sequence rather than a logic value (as in conventional latches). Possible scenarios in case of an SBU on the internal clock latch are summarized in Table 1 and illustrated in FIG. 1c. That is, when the memory is in an active state, the internal clock may not be triggered (e.g. cycle 106), may close early (e.g. cycle 108), or may be triggered between two cycles, i.e. twice in a single active cycle (e.g. cycle 102). When the memory is in an inactive state, the internal clock may be triggered erroneously once or more (e.g. cycle 104).

TABLE 1

| Mode | Failure mode of internal clock due to soft error |
|---|---|
| Active | Not triggered |
|  | Closed too early |
|  | Triggered twice in single active cycle |
| Inactive | Triggered once or more |

An existing approach for reducing SER in latches is shown in FIG. 2. In this approach, the latch circuit is modified by including a set of invertors by creating additional signals which stop the positive feedback of the latch in case only one of the nodes toggles due to soft error, thus reducing the FIT of the latch. However, the hard latch merely reduces the FIT rate but does not lower it down to zero, thus in case the latch flips, there is no detection and dangerous failures may occur. This approach penalizes the performance of the latch by introducing an extra load and cross resistance during the write step of the latch. Additionally, the logic becomes different from the classical latch and requires qualification and testing to quote the final FIT rate.

A need therefore exists to provide a circuit and method for detecting a single bit upset in a dynamic logic circuit that seeks to address at least one of the above problems, or to provide an alternative.

BRIEF DESCRIPTION OF THE DRAWINGS

Embodiments of the invention will be better understood and readily apparent to one of ordinary skill in the art from the following written description, by way of example only, and in conjunction with the drawings, in which:

FIG. 7b shows time-based waveforms illustrating an example flag output of the circuit of FIG. 7a.

FIG. 9 shows a flow chart illustrating a method for detecting an SBU in a dynamic logic circuit according to an example embodiment.

DETAILED DESCRIPTION

Figure 1A:
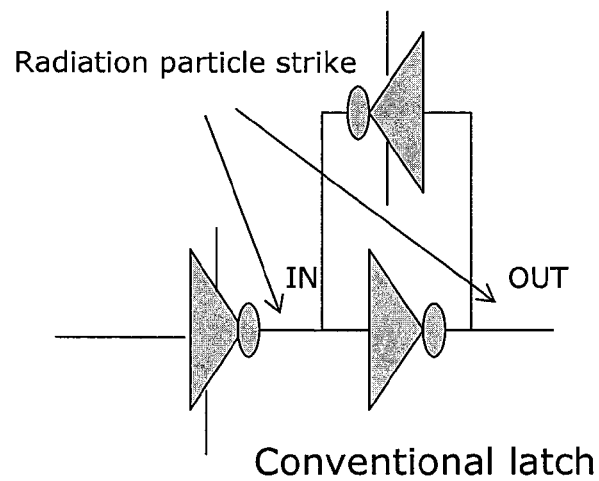
FIG. 1a shows a schematic circuit diagram illustrating a conventional latch.
Figure 1B:
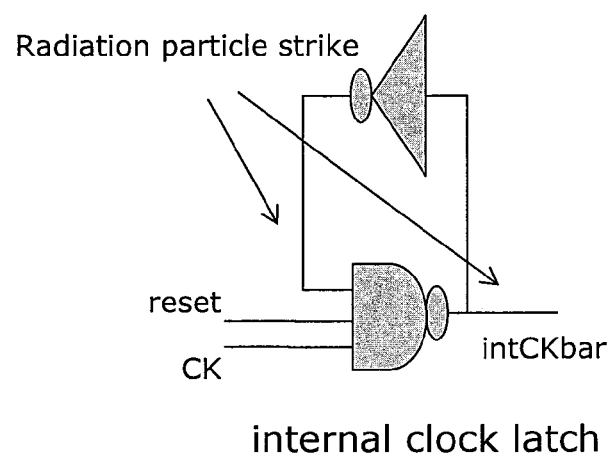
FIG. 1b shows a schematic circuit diagram illustrating a conventional internal clock latch.
Figure 1C:
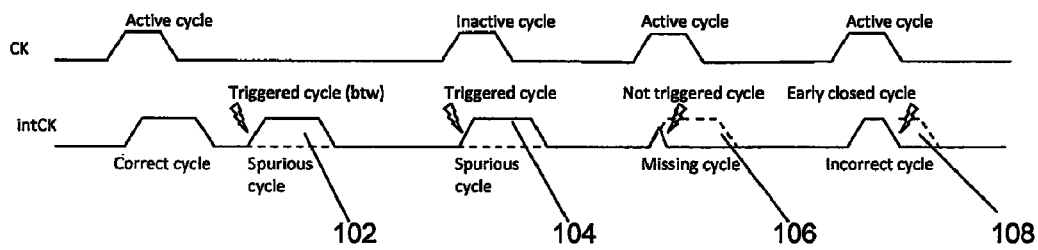
FIG. 1c shows signal graphs illustrating example failure modes of the internal clock in the event of an SBU.
Figure 2:
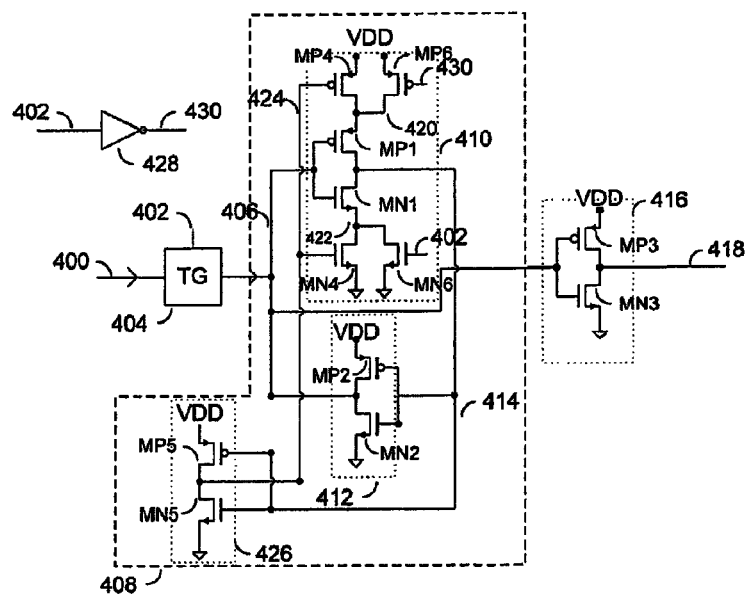
FIG. 2 shows a schematic circuit diagram illustrating an existing approach for reducing SER in latches.

In a self-timed memory, with the rising edge of the external clock signal, an internal clock signal is generated and latched until a successful operation. In the self-timed memory, the pulse width of the internal clock signal is typically determined by the memory e.g. according to the cut size. For example, the setting of the internal clock latch is done at the rising edge of an external clock signal while resetting is done by an internal reset signal. For example, the reset signal is typically generated after a predetermined time from the start of the internal clock pulse. This reset signal ensures a defined pulse width of an internal clock in order to have a correct operation.

Also, a soft error on the internal clock latch which may lead to an undesired operation can happen during an active operation or a non-active (i.e. inactive) operation. A soft error during an active operation can occur during timing constrained minimum clock high (tckh) time, thereby preventing the generation of the internal clock signal and causing a read/write failure. Such an error can also occur after tckh time, in which case the internal clock signal is generated but the pulse width, which should normally be determined by the memory reset signal, is disrupted by the soft error, resulting in a spurious/wrong read/write operation. A soft error due to an SBU during a non-active operation can lead to a wrong internal clock signal generation and corrupt the memory.

In accordance with a first aspect of an example embodiment, there is provided a circuit for detecting an SBU in a dynamic logic circuit, the circuit configured to generate a flag signal indicative of the SBU in a previous cycle of an external clock signal based on an internal signal indicative of self-timed memory of the dynamic logic circuit.

The internal signal may comprise a resetbar signal.

The circuit may comprise a single latch, wherein inputs to the single latch may comprise the resetbar signal and an internal clock signal.

The single latch may be configured to set the flag signal at the output of the single latch to logic '0' by a rising edge of the external clock signal.

The single latch may be configured, during an active operation mode, to set the flag signal at the output of the single latch to logic '1', indicative of a correct previous cycle, only if both the resetbar signal and the internal clock signal are high in a valid sequence.

The single latch may be configured, during a non-active operation mode, to set the flag signal at the output of the single latch to logic '0', indicative of a correct previous cycle, only if both the resetbar signal and the internal clock signal are low.

The circuit may comprise two latches, wherein inputs to a first latch may comprise a signal indicative of a rising edge of an internal clock signal and a NAND-gate output based on the external clock signal and CK_nand; and inputs to a second latch may comprise an AND-gate output based on the resetbar signal and the internal clock signal, a NAND-gate output based on the external clock signal and CK_nand, and an output from the first latch.

The first and second latches may be configured to set the flag signal at the output of the second latch to logic '1', indicative of a correct previous cycle, only if, during an active operation mode, the signal indicative of the rising edge of the internal clock signal is detected and the resetbar signal and the internal clock signal are high in a valid sequence.

In accordance with a second aspect of an example embodiment, there is provided a method of detecting an SBU in a dynamic logic circuit, the method comprising using a circuit to generate a flag signal indicative of the SBU in a previous cycle of an external clock signal based on an internal signal indicative of self-time memory of the dynamic logic circuit.

The internal signal may comprise a resetbar signal.

The circuit may comprise a single latch, the method may further comprise using the resetbar signal and an internal clock signal as inputs to the single latch.

Generating a flag signal indicative of the SBU in a previous cycle of the external clock signal may comprise setting the flag signal at the output of the single latch to logic '0' by a rising edge of the external clock signal.

The method may further comprise, during an active operation mode, setting the flag signal at the output of the single latch to logic '1', indicative of a correct previous cycle, only if both the resetbar signal and the internal clock signal are high in a valid sequence.

The method may further comprise, during a non-active operation mode, setting the flag signal at the output of the single latch to logic '0', indicative of a correct previous cycle, only if both the resetbar signal and the internal clock signal are low.

The circuit may comprise two latches, the method may further comprise using a signal indicative of a rising edge of an internal clock signal and a NAND-gate output based on the external clock signal and CK_nand as inputs to a first latch; and using an AND-gate output based on the resetbar signal and the internal clock signal, a NAND-gate output based on the external clock signal and CK_nand, and an output from the first latch as inputs to a second latch.

The method may further comprise setting the flag signal at the output of the second latch to logic '1', indicative of a correct previous cycle, only if, during an active operation mode, the signal indicative of the rising edge of the internal clock signal is detected and the resetbar signal and the internal clock signal are high in a valid sequence.

Figure 3:
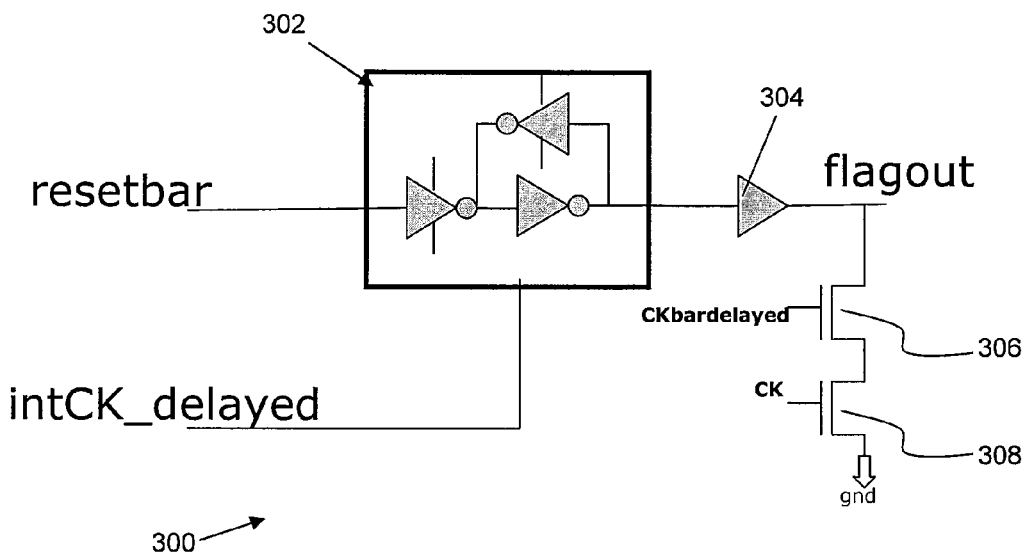
FIG. 3 shows a schematic circuit diagram illustrating a circuit for detecting a SBU in a dynamic circuit according to an example embodiment.
Figure 4:
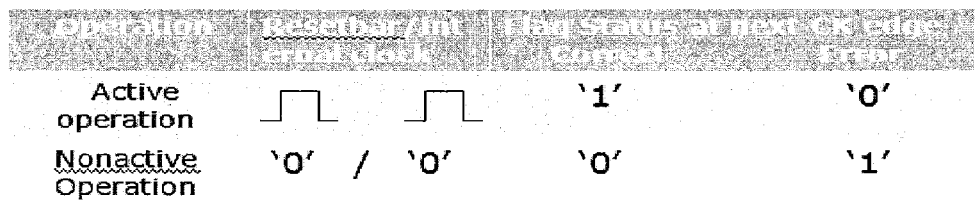
FIG. 4 shows a table summarizing flag status in the circuit of FIG. 3 according to an example embodiment.

In one example embodiment, a flag is generated if an undesired operation happens in the memory due to an SBU at the internal clock latch. FIG. 3 shows a schematic circuit diagram illustrating a circuit 300 for detecting an SBU in a dynamic circuit according to an example embodiment. FIG. 4 shows a table summarizing flag status in the circuit of FIG. 3 according to an example embodiment.

Here, the resetbar signal (a complementary/inverted version of the reset signal) is captured by a delayed internal clock signal and transferred as a flag. As shown in FIG. 3, a resetbar signal and an intCK_delayed signal (a bufferised/delayed version of the internal clock signal intCK and having the same polarity with intCK) are provided to a latch 302, which comprises a plurality of inverters. An output signal from the latch 302 is delayed at delay 304 before generating a flag output flagout. In addition, input signal CKbardelayed (a complementary/inverted version of the external clock signal CK and having a predetermined amount of delay) and the external clock signal CK are provided to transistors 306, 308 for generating the flag output flagout. As illustrated in FIG. 4, during an active operation mode, the correct flag output at the next CK rising edge is "1" only if both the resetbar signal and the internal clock signal are high. During a non-active operation mode, the correct flag output at the next CK rising edge is "0" only if both the resetbar signal and the internal clock signal are low.

Figure 5:
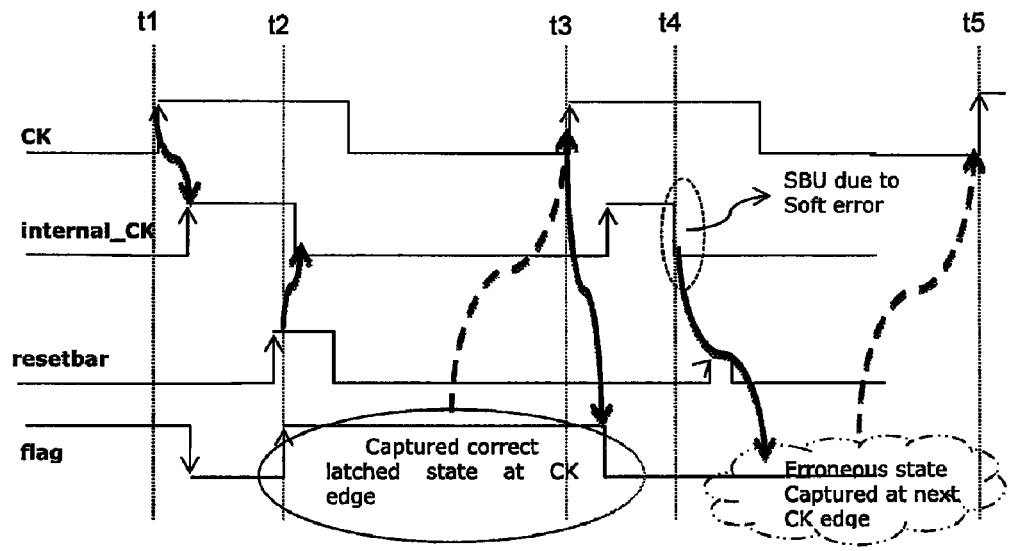
FIG. 5 shows time-based waveforms of signals in the circuit of FIG. 3 when the memory is in an active operation.

FIG. 5 shows time-based waveforms of signals in the circuit of FIG. 3 when the memory is in an active operation, e.g. the concrete syntax notation is set to 0 (CSN==0). At each new cycle, e.g. at or around time t1, with the rising edge of the external clock signal CK, the flag output is reset to an erroneous state (e.g. at logic "0"). If the current cycle is valid, e.g. based on CSN information available at the system on a chip (SOC), the latch 302 captures the resetbar signal, e.g. at time t2, and sets the flag output at logic "1". At the falling edge of the internal clock signal internal_CK, the flag output remains at logic "1" and is available for checking at the next rising edge of the external clock signal CK, e.g. at time t3. If the flag output is at logic "1" at that time, the previous cycle is considered a correct cycle.

On the other hand, if an SBU causes a wrong transition on the internal clock signal internal_CK during operation, e.g. the internal clock signal closes at time t4 before the resetbar signal starts, the latch 302 captures logic "0", which is the status of the resetbar signal at that time. Thus, at the next rising edge of the external clock signal CK, e.g. at time t5, this erroneous state informs the user that the previous cycle has been a corrupted/bad cycle.

Figure 6:
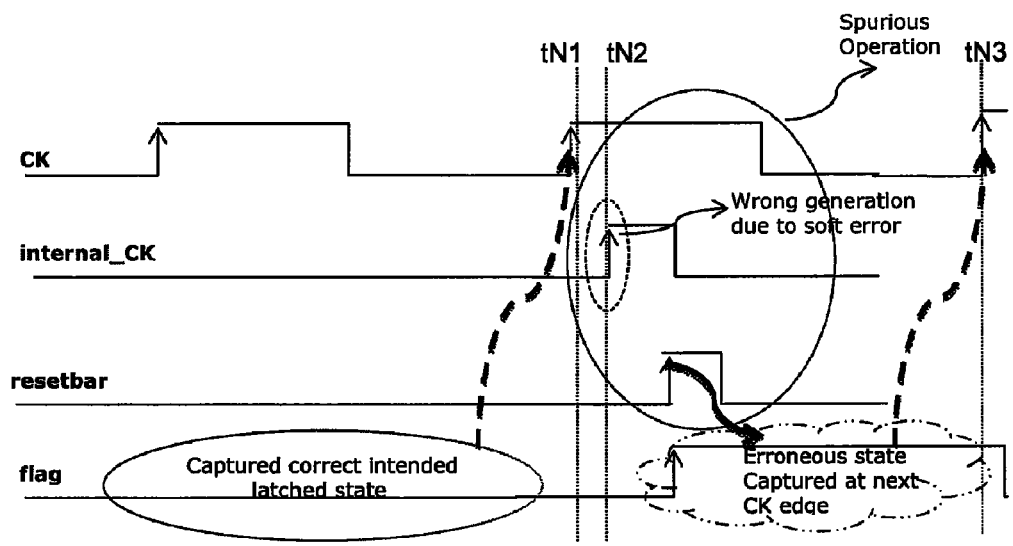
FIG. 6 shows time-based waveforms of signals in the circuit of FIG. 3 when the memory is in a non-active operation.

FIG. 6 shows time-based waveforms of signals in the circuit of FIG. 3 when the memory is in a non-active operation, e.g. CSN==1. During a non-active operation, the flag output remains at logic "0" and shows the user, e.g. at time tN1, that there has been no operation held in the previous cycle. However, if the internal clock is erroneously generated during a non-active cycle, e.g. at time tN2, the latch 302 captures logic "1" because of a non-intended transition on the resetbar signal and the internal clock signal. Thus, the flag output is set to logic "1" which shows the user at the next rising edge of the external clock signal CK, e.g. at time tN3, that the previous cycle has been corrupted, since during a non-active operation there should not be any internal clock generation and the flag output should remain at logic "0" as shown in FIG. 4.

Figure 7A:
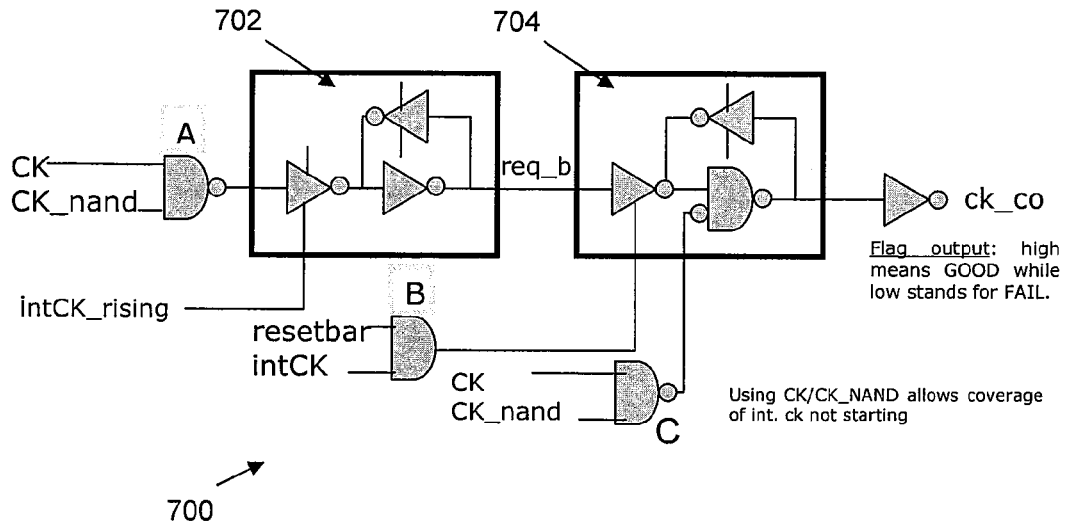
FIG. 7a shows a schematic circuit diagram illustrating a circuit for detecting a SBU in a dynamic circuit according to an alternate embodiment.

FIG. 7a shows a schematic circuit diagram illustrating a circuit 700 for detecting an SBU in a dynamic circuit according to an alternate embodiment. In this embodiment, the circuit comprises a first latch 702 connected in series to a second latch 704. As shown in FIG. 7, the first latch 702 comprises a plurality of inverters while the second latch 704 comprises a plurality of inverters and a NAND logic gate. Inputs to the first latch 702 include the external clock signal CK, the CK_nand signal (a NAND output of a delayed external clock signal CK and the CSN value) and the intCK_rising signal which comprises short pulses tracking the rising edge of the internal clock signal. In one example embodiment, inputs CK and CK_nand are passed through a NAND gate A before being provided to the first latch 702.

An output req_b from the first latch 702 is then provided to the second latch 704. Additionally, other inputs to the second latch 704 include the resetbar signal, the internal clock signal intCK, the external clock signal CK and the CK_nand signal. In one example embodiment, the resetbar signal and the internal clock signal intCK are passed through an AND gate B before being provided to the second latch 704. Also, the external clock signal CK and the CK_nand signals are passed through a NAND gate C before being provided to the second latch 704. The use of signals CK/CK_nand in this embodiment allows coverage of instances where the internal clock does not start, e.g. during inactive cycles.

Figure 7B:
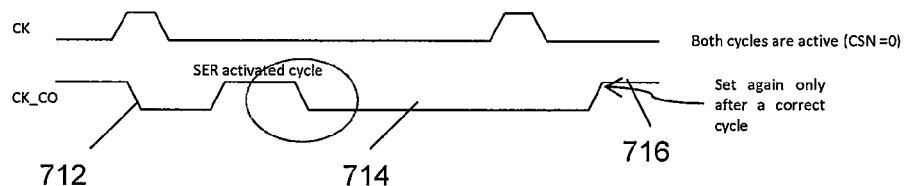

FIG. 7b shows time-based waveforms illustrating an example flag output of the circuit of FIG. 7a. In one example embodiment, the flag output ck_co is set to logic "1" only if three conditions are met, i.e. an operation is expected (CSN=="0" and CK==rising), internal clock signal intCK is properly triggered and closed by resetbar pulse.

For example, at the beginning of each cycle, the flag output ck_co is reset to logic "0" after rising edge of the external clock signal CK, e.g. at 712. At the same time, the first latch 702 captures the output of the NAND logic gate A, which is "0" for an active operation and "1" for an inactive operation. This latched value is transferred to the flag output ck_co only if the resetbar signal is overlapping with the internal clock signal intCK (i.e. the internal clock is closed by the resetbar signal).

In case of a soft error occurring on the internal clock latch, the flag output ck_co stays at logic "0", e.g. at 714, and is set to "1" again only after a correct cycle, e.g. at 716. In an active cycle, the effect of a soft error can be an internal clock pulse that is too short or even no internal clock pulse, and the latched value is not shifted/transferred to the output. In an inactive cycle, the effect can be an unexpected working operation but the latched value, which is shifted, confirms the flag (failing) state. The circuit according to this example embodiment can thus detect SBU even if there are two operations within the same cycle, one due to normal operation and another due to a soft error (during tckl time).

Figure 8A:
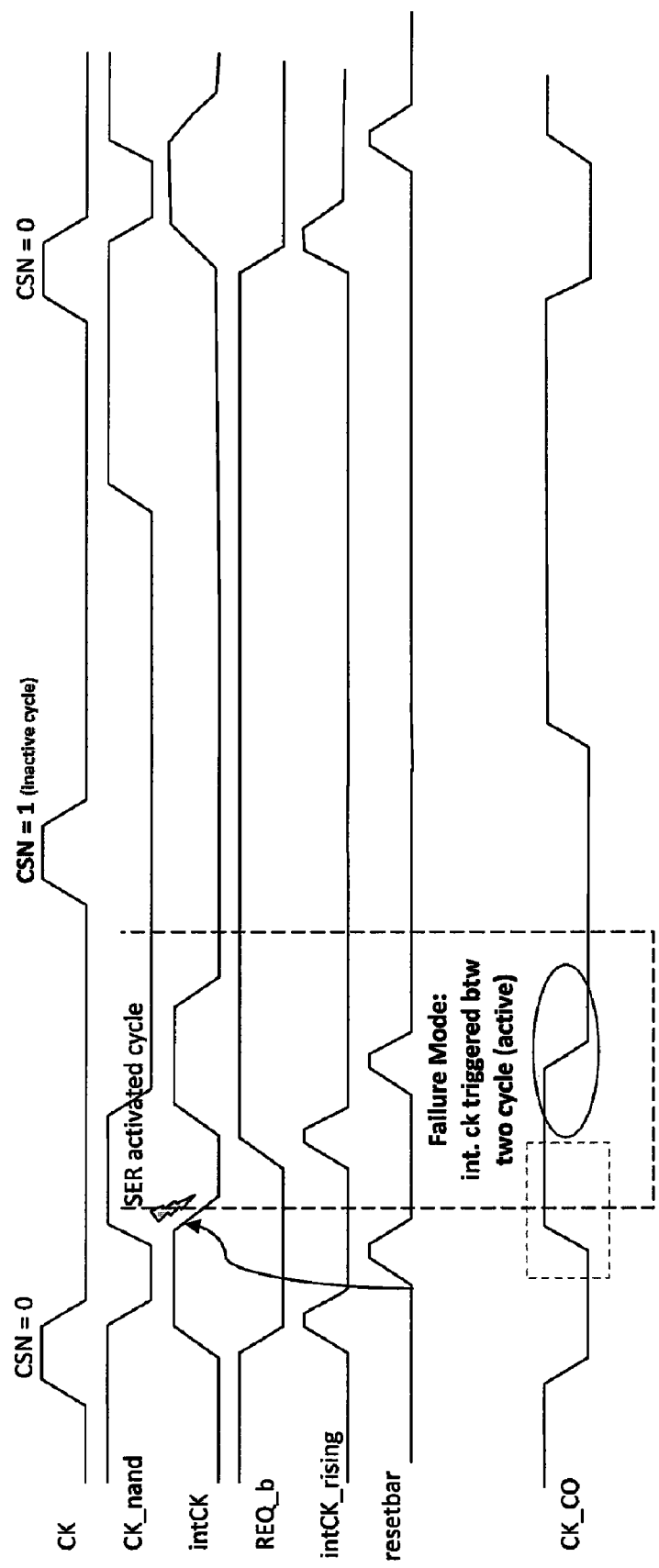
FIG. 8a shows time-based waveforms of signals in the circuit of FIG. 7a illustrating detection of a first failure mode.
Figure 8B:
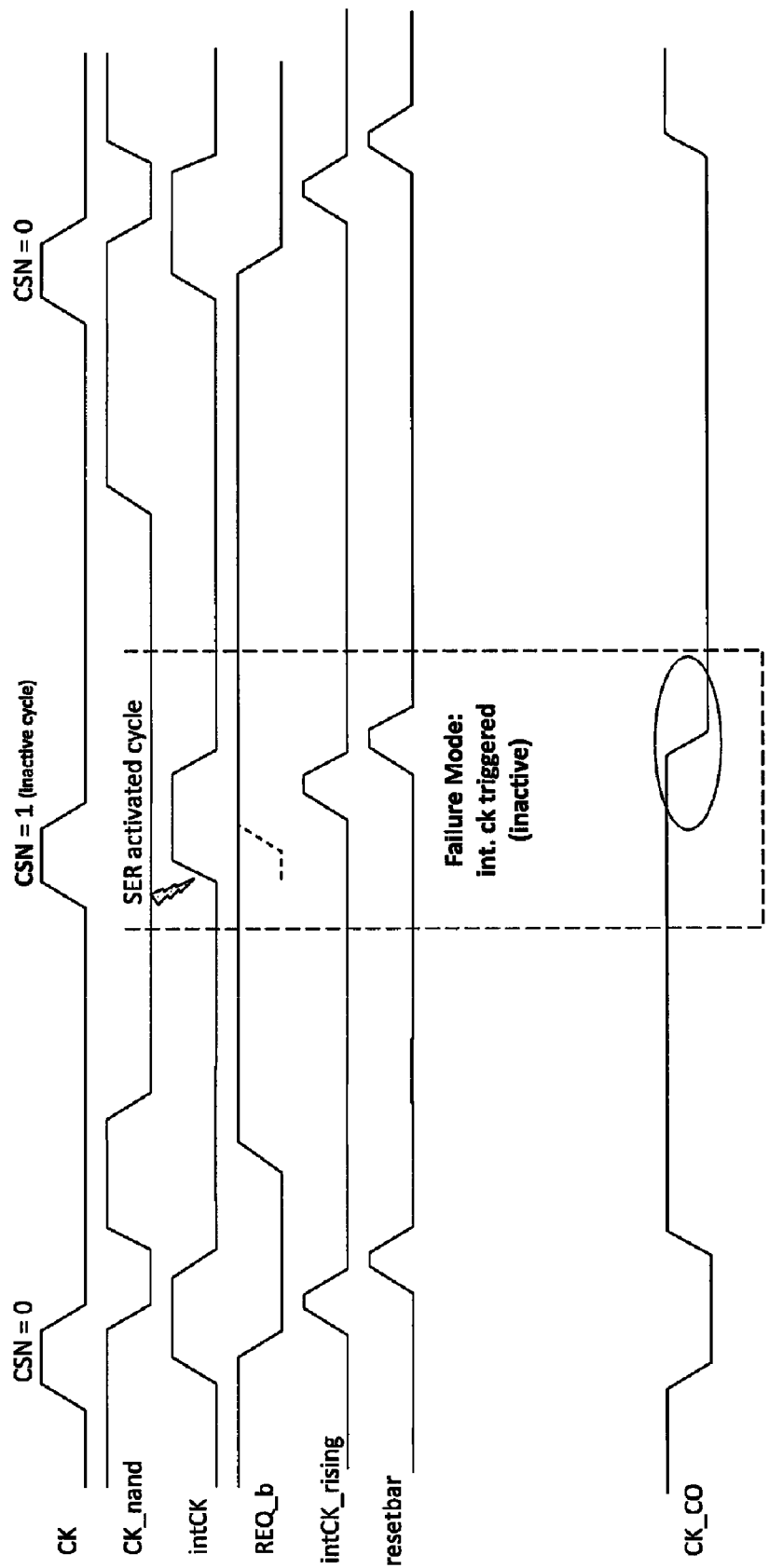
FIG. 8b shows time-based waveforms of signals in the circuit of FIG. 7a illustrating detection of a second failure mode.
Figure 8C:
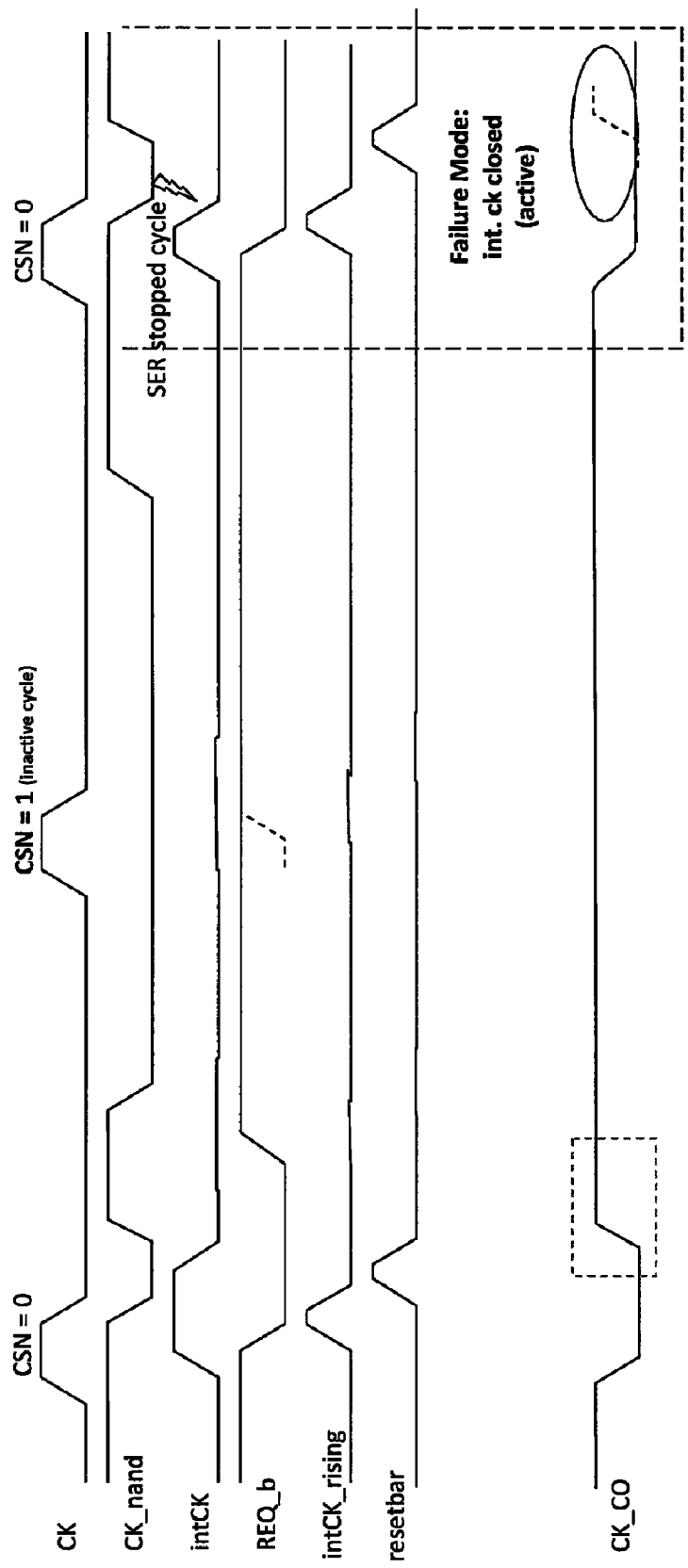
FIG. 8c shows time-based waveforms of signals in the circuit of FIG. 7a illustrating detection of a third failure mode.

With reference to FIGS. 8a-8c, some example detections of SBU events are now described. FIG. 8a shows time-based waveforms of signals in the circuit of FIG. 7a illustrating detection of a first failure mode. In FIG. 8a, an SBU causes an internal clock pulse to be generated one more times between two external clock cycles while the memory is in an active operation mode. Here, the first pulse of intCK is valid and the second pulse is erroneous. However, such SBU is detected by the output of the gate A which is captured as the wrong status for the second intCK pulse generated by SBU. The detection is exemplified by a drop in the flag signal ck_co from logic "1" to logic "0" in FIG. 8a (the flag signal co_ck should remain at logic "1" if the SBU does not occur).

FIG. 8b shows time-based waveforms of signals in the circuit of FIG. 7a illustrating detection of a second failure mode. In FIG. 8b, an SBU causes an erroneous internal clock pulse to be generated when the memory is in a non-active state (CSN==1). However, such SBU is detected by the latch circuit because in this case the pulse is generated when CSN==1 (i.e. the condition CSN==0 is not satisfied). The detection is exemplified by a drop in the flag signal ck_co from logic "1" to logic "0" in FIG. 8b (the flag signal co_ck should remain at logic "1" if the SBU does not occur).

FIG. 8c shows time-based waveforms of signals in the circuit of FIG. 7a illustrating detection of a third failure mode. In FIG. 8c, an SBU causes the internal clock pulse to close early before the resetbar signal is generated. However, such SBU is detected by the latch circuit because in this case the resetbar signal does not overlap the internal clock signal. The detection is exemplified by the flag signal ck_co continuing at logic "0" in FIG. 8c (the flag signal ck_co should change to logic "1" if the SBU does not occur).

FIG. 9 shows a flow chart 900 illustrating a method of detecting a single bit upset in a dynamic logic circuit according to an example embodiment. At step 902, a circuit is used to generate a flag signal indicative of the single bit upset in a previous cycle of an external clock signal based on an internal signal indicative of self-timed memory of the dynamic logic circuit.

It will be appreciated by a person skilled in the art that numerous variations and/or modifications may be made to the present invention as shown in the specific embodiments without departing from the spirit or scope of the invention as broadly described. For example, the designation of logic "0" or "1" for the flag output may be reversed, as compared to the example embodiments described. Also, any delay can be adjusted depending on the operation requirements. The present embodiments are, therefore, to be considered in all respects to be illustrative and not restrictive.

The invention claimed is:

1. A circuit receiving an internal clock signal and an external clock signal for detecting a single bit upset in a dynamic logic circuit, the circuit configured to generate a flag signal indicative of the single bit upset in a previous cycle of the external clock signal based on an internal signal indicative of self-timed memory of the dynamic logic circuit, wherein the internal and external clock signals are distinct.

2. The circuit as claimed in claim 1, wherein the internal signal comprises a resetbar signal.

3. The circuit as claimed in claim 2, comprising a single latch, wherein inputs to the single latch comprise the resetbar signal and the internal clock signal.

4. The circuit as claimed in claim 3, wherein the single latch is configured to set the flag signal at the output of the single latch to logic '0' by a rising edge of the external clock signal.

5. The circuit as claimed in claim 3, wherein the single latch is configured, during an active operation mode, to set the flag signal at the output of the single latch to logic '1', indicative of a correct previous cycle, only if both the resetbar signal and the internal clock signal are high in a valid sequence.

6. The circuit as claimed in any one of claim 3, wherein the single latch is configured, during a non-active operation mode, to set the flag signal at the output of the single latch to logic '0', indicative of a correct previous cycle, only if both the resetbar signal and the internal clock signal are low.

7. The circuit as claimed in claim 1, comprising two latches, wherein inputs to a first latch comprise a signal indicative of a rising edge of the internal clock signal and a NAND-gate output based on the external clock signal and CK_nand; and inputs to a second latch comprise an AND-gate output based on the resetbar signal and the internal clock signal, a NAND-gate output based on the external clock signal and CK_nand, and an output from the first latch.

8. The circuit as claimed in claim 7, wherein the first and second latches are configured to set the flag signal at the output of the second latch to logic '1', indicative of a correct previous cycle, only if, during an active operation mode, the signal indicative of the rising edge of the internal clock signal is detected and the resetbar signal and the internal clock signal are high in a valid sequence.

9. A method of detecting a single bit upset in a dynamic logic circuit that receives an internal clock signal and an external clock signal, the method comprising using a circuit to generate a flag signal indicative of the single bit upset in a previous cycle of the external clock signal based on an internal signal indicative of self-timed memory of the dynamic logic circuit, wherein the internal and external clock signals are distinct.

10. The method as claimed in claim 9, wherein the internal signal comprises a resetbar signal.

11. The method as claimed in claim 10, wherein the circuit comprises a single latch, the method further comprising using the resetbar signal and the internal clock signal as inputs to the single latch.

12. The method as claimed in claim 11, wherein generating a flag signal indicative of the single bit upset in a previous cycle of the external clock signal comprises setting the flag signal at the output of the single latch to logic '0' by a rising edge of the external clock signal.

13. The method as claimed in claim 11, further comprising, during an active operation mode, setting the flag signal at the output of the single latch to logic indicative of a correct previous cycle, only if both the resetbar signal and the internal clock signal are high in a valid sequence.

14. The method as claimed in claim 11, further comprising, during a non-active operation mode, setting the flag signal at the output of the single latch to logic '0', indicative of a correct previous cycle, only if both the resetbar signal and the internal clock signal are low.

15. The method as claimed in claim 9, wherein the circuit comprises two latches, the method further comprising using a signal indicative of a rising edge of the internal clock signal and a NAND-gate output based on the external clock signal and CK_nand as inputs to a first latch; and using an AND-gate output based on the resetbar signal and the internal clock signal, a NAND-gate output based on the external clock signal and CK_nand, and an output from the first latch as inputs to a second latch.

16. The method as claimed in claim 15, further comprising setting the flag signal at the output of the second latch to logic '1', indicative of a correct previous cycle, only if, during an active operation mode, the signal indicative of the rising edge of the internal clock signal is detected and the resetbar signal and the internal clock signal are high in a valid sequence.

17. A circuit for detecting a single bit upset in a dynamic logic circuit comprising:
a latch circuit having an input for receiving a reset signal, and an output for providing a flag output signal, the latch circuit being clocked by a first clock signal;
a first transistor having a drain coupled to the output of the latch circuit, a gate for receiving a second clock signal, and a source; and
a second transistor having a drain coupled to the source of the first transistor, a gate for receiving a third clock signal, and a source coupled to ground.

18. The circuit of claim 17 wherein the latch circuit comprises a latch in series with a delay element.

19. The circuit of claim 17 wherein the first clock signal comprises an internal clock signal.

20. The circuit of claim 19 wherein the second and third clock signals comprise external clock signals.

* * * * *

UNITED STATES PATENT AND TRADEMARK OFFICE
CERTIFICATE OF CORRECTION

PATENT NO. : 8,378,711 B2
APPLICATION NO. : 13/038236
DATED : February 19, 2013
INVENTOR(S) : Chirag Gulati et al.

It is certified that error appears in the above-identified patent and that said Letters Patent is hereby corrected as shown below:

In the Claims:

Column 8, line 12, after "logic" insert --'1',--

Signed and Sealed this
Twenty-third Day of April, 2013

Teresa Stanek Rea
*Acting Director of the United States Patent and Trademark Office*